United States Patent
Tang et al.

(10) Patent No.: US 8,448,695 B2
(45) Date of Patent: May 28, 2013

(54) HEAT DISSIPATING APPARATUS

(75) Inventors: Xian-Xiu Tang, Shenzhen (CN); Zhen-Xing Ye, Shenzhen (CN)

(73) Assignees: Hong Fu Jin Precision Industry (ShenZhen) Co., Ltd., Shenzhen (CH); Hon Hai Precision Industry Co., Ltd., New Taipei (TW)

( * ) Notice: Subject to any disclaimer, the term of this patent is extended or adjusted under 35 U.S.C. 154(b) by 374 days.

(21) Appl. No.: 12/796,647

(22) Filed: Jun. 8, 2010

(65) Prior Publication Data
US 2011/0290455 A1 Dec. 1, 2011

(30) Foreign Application Priority Data
May 26, 2010 (CN) .......................... 2010 1 0183554

(51) Int. Cl.
*F28F 7/00* (2006.01)
*H05K 7/20* (2006.01)

(52) U.S. Cl.
USPC .......................................... 165/80.3; 165/78

(58) Field of Classification Search
CPC ........ F28F 3/16; A23L 3/20; G06F 1/20; H01L 23/467
USPC .............. 165/80.3, 104.34, 96, 98, 121, 80.2, 165/67, 77, 78; 361/695, 697, 679.48, 679.49, 361/679.51, 703
See application file for complete search history.

(56) References Cited

U.S. PATENT DOCUMENTS

| | | | | |
|---|---|---|---|---|
| 7,304,845 B2* | 12/2007 | Xia et al. | ...................... | 361/697 |
| 7,403,389 B2* | 7/2008 | Yao et al. | ...................... | 361/695 |
| 7,766,074 B2* | 8/2010 | Lin et al. | ...................... | 165/80.2 |
| 7,929,304 B2* | 4/2011 | Cao et al. | ...................... | 361/697 |
| 7,969,728 B2* | 6/2011 | Zheng et al. | ............. | 361/679.51 |
| 8,245,762 B2* | 8/2012 | Cao | ............................ | 165/80.3 |
| 2005/0161201 A1* | 7/2005 | Shiang-Chich | ............... | 165/121 |
| 2006/0137861 A1* | 6/2006 | Wang et al. | ............. | 165/104.33 |
| 2007/0145572 A1* | 6/2007 | Chen et al. | ..................... | 257/718 |
| 2008/0019094 A1* | 1/2008 | Xia et al. | ...................... | 361/700 |
| 2010/0172089 A1* | 7/2010 | Chiu et al. | ............... | 361/679.47 |
| 2011/0100600 A1* | 5/2011 | Tang et al. | ...................... | 165/96 |

* cited by examiner

*Primary Examiner* — Tho V Duong
(74) *Attorney, Agent, or Firm* — Atlis Law Group, Inc.

(57) ABSTRACT

A heat dissipating apparatus includes a heat sink, a fan, and an airflow guide. The heat sink includes a conducting base board and a number of parallel fins vertically extending from the conducting base board. An air intake and an air outlet are defined in opposite ends of the heat sink. The airflow guide includes a mounting cover accommodating the heat sink, and a guiding element connected to the mounting cover. The fan is mounted to the mounting cover and at the air intake of the heat sink. The guiding element is arranged at the air outlet of the heat sink. The guiding element includes a guiding board. An angle between the guiding board and the fins at the air outlet is less than 90 degrees and more than 0 degrees.

3 Claims, 4 Drawing Sheets

HEAT DISSIPATING APPARATUS

BACKGROUND

1. Technical Field

The present disclosure relates to a heat dissipating apparatus.

2. Description of Related Art

To dissipate heat generated by heat-generating elements, such as central processing units (CPUs), of a motherboard, some heat dissipating apparatuses are mounted on the heating elements. However, some small elements arranged nearby these heat-generating elements cannot be cooled effectively.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawing, is illustrated by way of example and not by way of limitation. It should be noted that references to "an" or "one" embodiment in this disclosure are not necessarily to the same embodiment, and such references mean at least one.

Figure 1:
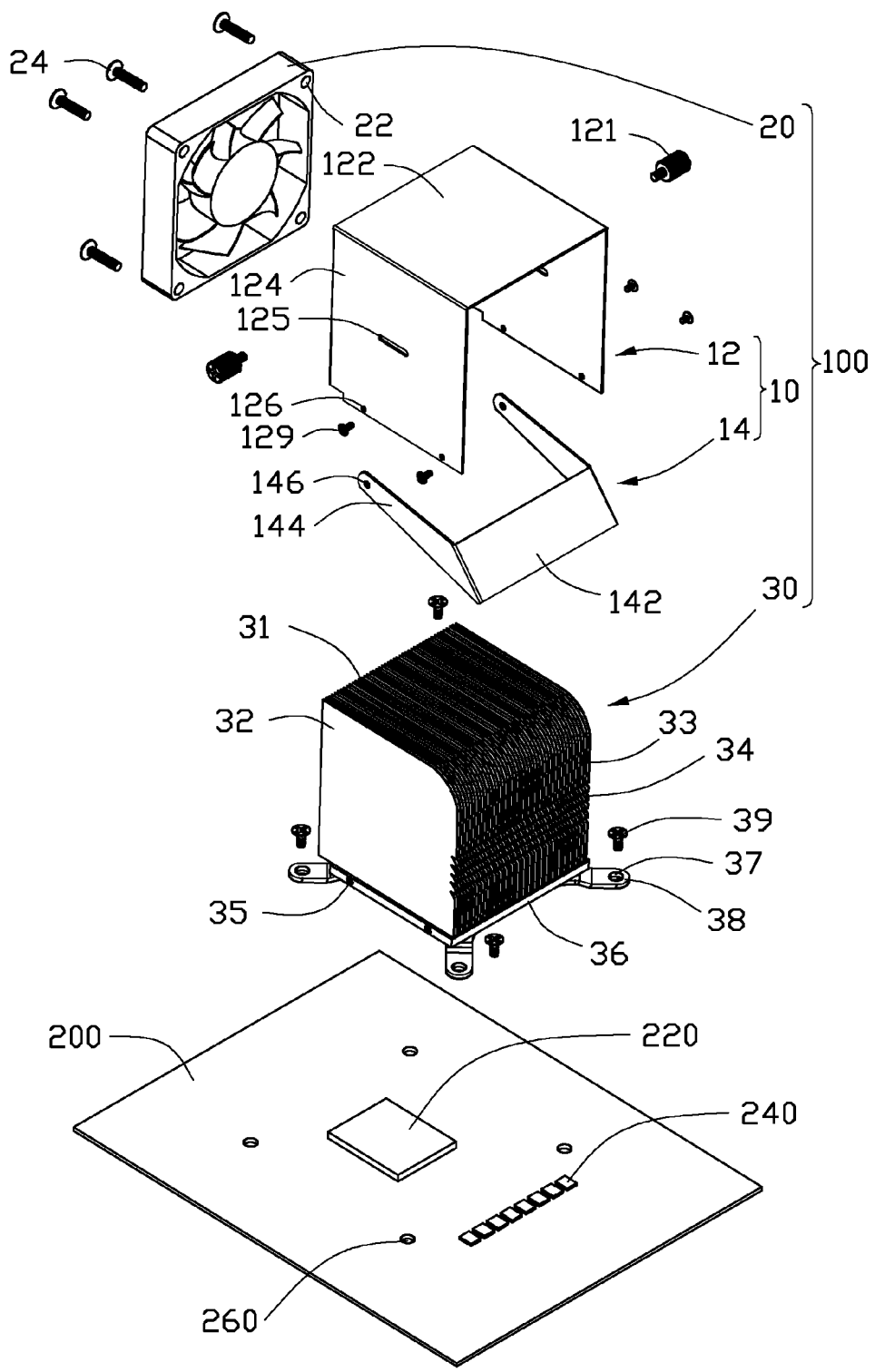
FIG. 1 is an exploded, isometric view of an embodiment of a heat dissipating apparatus, together with a motherboard.
Figure 2:
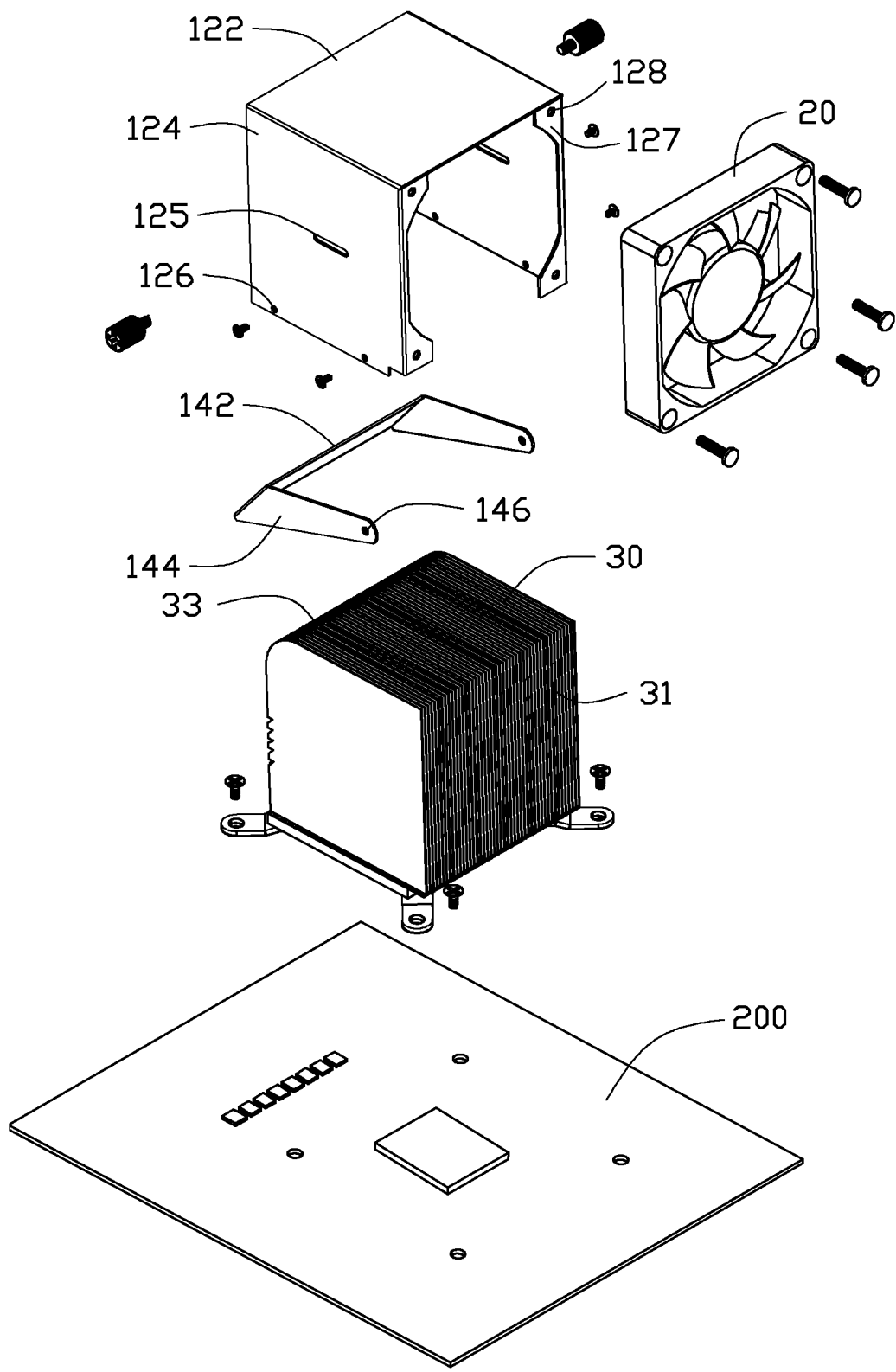
FIG. 2 is similar to FIG. 1, but viewed from another perspective.

Referring to FIGS. 1 and 2, an embodiment of a heat dissipating apparatus 100 includes an airflow guide 10, a fan 20, and a heat sink 30.

The fan 20 respectively defines four through holes 22 in four corners of the fan 20. The heat sink 30 includes a conducting base board 36, a plurality of parallel fins 32 vertically mounted on the conducting base board 36, and four connecting portions 38 respectively extending from four corners of the conducting base board 36. Each connecting portion 38 defines a mounting hole 37 in a distal end of the connecting portion 38. An airflow channel (not labeled) is defined between every two adjacent fins 32. The airflow channel includes an air intake 31 at a first end of the airflow channel, and an air outlet 33 at a second end of the airflow channel opposite to the first end. The fins 32 further define a plurality of slots 34 therein parallel with the conducting base board 36, at the air outlet 33. The conducting base board 36 defines two screw holes 35 in each sidewall of the conducting base board 36.

The airflow guide 10 includes a U-shaped mounting cover 12 and a guiding element 14. The mounting cover 12 includes a top board 122, and two side boards 124 vertically extending down from two opposite sides of the top board 122. A slim fan mounting portion 127 vertically extends from a rear side of each side board 124. Each fan mounting portion 127 defines two screw holes 128 corresponding to the through holes 22 of the fan 20. Each side board 124 defines a sliding groove 125 in a center of the side board and parallel to the top board 122. A lower side of each side board 124 defines two through holes 126 corresponding to the screw holes 35 of the conducting base board 36.

The guiding element 14 includes a rectangular slanted guiding board 142 and two connecting boards 144 extending rearwards from opposite ends of the guiding board 142. Each connecting board 144 defines a screw hole 146 in a distal end of the connecting board 144. A distance between outside walls of the two connecting board 144 is about equal to a distance between inside walls of the two side boards 124.

Figure 3:
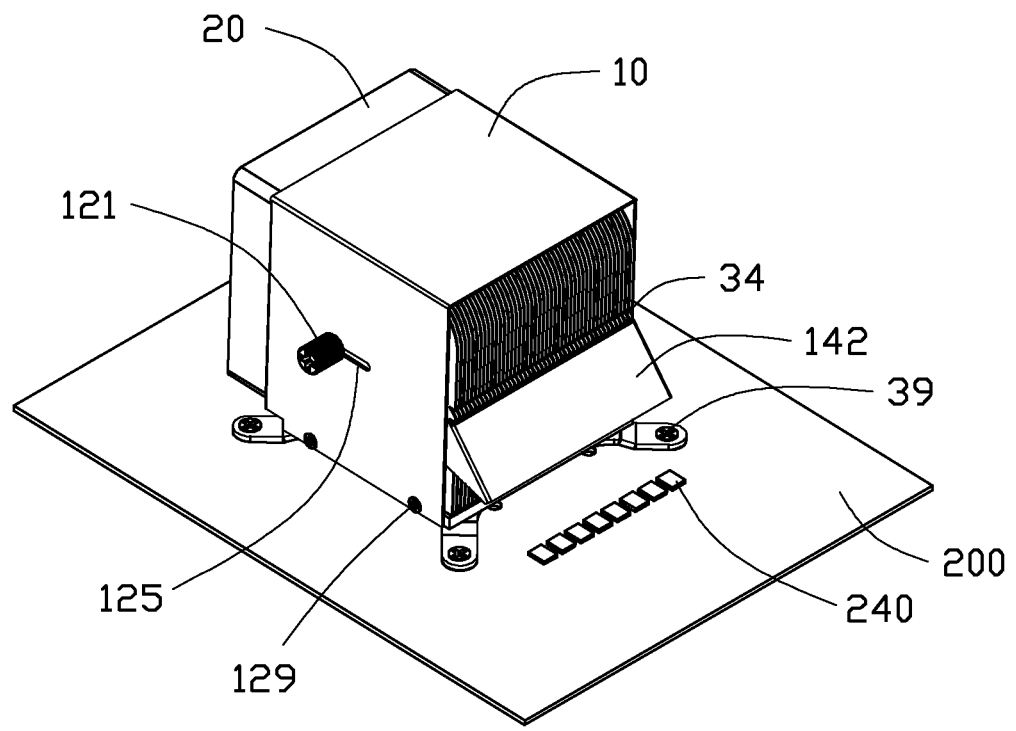
FIG. 3 is an assembled view of FIG. 1, in a first state.
Figure 4:
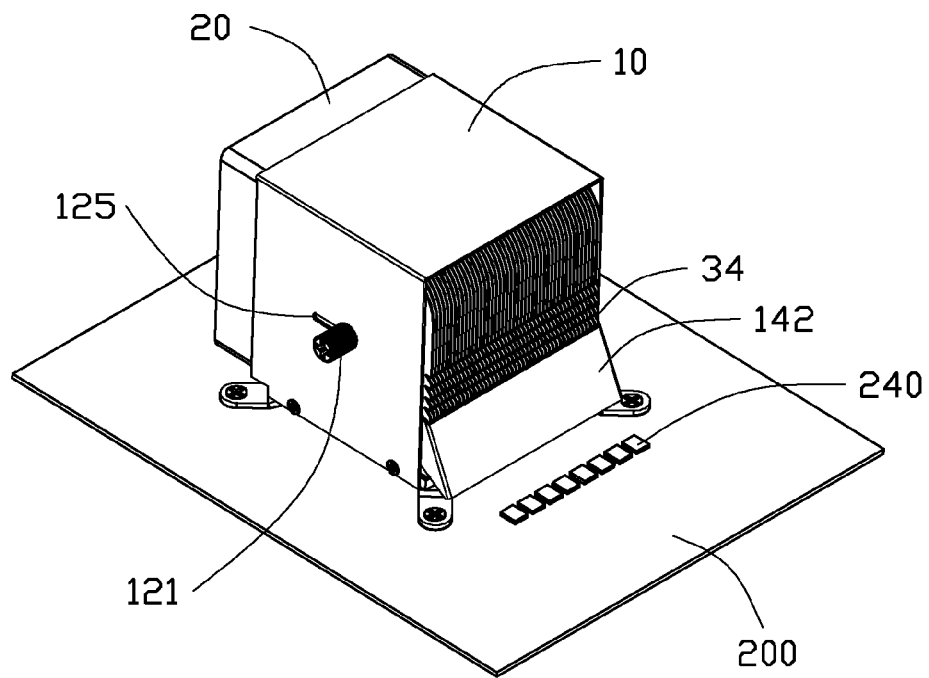
FIG. 4 is similar to FIG. 3, but showing a second state.

Referring to FIGS. 3 and 4, in assembly, four screws 24 are inserted into the four through holes 22 of the fan 20, and then screwed in the four screw holes 128 of the airflow guide 10, fixing the fan 20 to the airflow guide 10. The guiding element 14 is arranged in the mounting cover 12, and two fasteners such as screws 121 are inserted into the two sliding grooves 125 and screwed in the screw holes 146 of the two connecting boards 144. The screws 121 can be slid in the two sliding grooves 125 to move the guiding element 14; thereby a position of the guiding board 142 relative to the mounting cover 12 is adjustable such that the distance between the guiding board 142 and the conducting base board 36 can be adjusted. Four screws 39 are inserted into the mounting holes 37 of the heat sink 30, and then screwed in four corresponding screw holes 260 of a motherboard 200. At this time, the conducting base board 36 is attached on a heat element 220, such as a central processing unit. In one embodiment, a row of small elements 240, such as field-effect transistors, are arranged on the motherboard 200 near the heat element 220.

The airflow guide 10 covers the heat sink 30, with the fan 20 arranged at the air intake 31 and the guiding board 142 arranged at the air outlet 33. A rear of the guiding board 142 resists against one of the slots 34 according to positions of the screws 121 in the sliding grooves 125. The rear of the guiding board 142 can be adjusted to resist against portions bounding any one of the slots 34 by moving the screws 121 in the sliding grooves 125. An angle between the guiding board 142 and the fins 32 at the air outlet 33 is less than 90 degrees and more than 0 degrees, and the angle can be adjusted by positioning screws 121 and the guiding board 141 on the slots 34 differently. For instance, a slantwise angle between the guiding board 142 and the air outlet 33 of the heat sink 30 of FIG. 3 is greater than a slantwise angle between the guiding board 142 and the air outlet 33 of the heat sink 30 of FIG. 4.

In use, the wind generated by the fan 20 flows through the air intake 31, the fins 32, and is expelled from the air outlet 33. Because the guiding board 142 is arranged at the air outlet 33, the wind is guided along the guiding board 142 to cool the small elements 240, which can increase heat dissipation for the small elements 240.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A heat dissipating apparatus comprising:
   a heat sink comprising a conducting base board and a plurality of parallel fins vertically extending up from the conducting base board, an air intake and an air outlet defined in opposite ends of the heat sink;
   a fan; and an airflow guide comprising a mounting cover accommodating the heat sink, and a guiding element movably connected to the mounting cover, wherein the fan is mounted to the mounting cover and at the air intake of the heat sink, the guiding element is arranged at the air outlet of the heat sink, the guiding element comprises a guiding board adjustable in a distance relative to the conducting base board, and an angle between the guiding board and a surface formed by ends of the fins at the air outlet is less than 90 degrees and more than 0 degrees and is adjusted in response to the guiding board being moved;

wherein the mounting cover comprises a top board and two side boards extending downwards from opposite sides of the top board, a fan mounting portion extends from a rear side of each of the side boards to mount the fan, the guide element is mounted to the two side boards, and the guide board is exposed outside of the mounting cover; and wherein each side board of the mounting cover defines a sliding groove, the guiding element further comprises two connecting boards extending from opposite ends of the guiding board, each connecting board defines a screw hole in a distal end of the connecting board, the connecting boards are mounted to the mounting cover by two screws extending through the sliding grooves and being screwed in the screw holes of the connecting boards.

2. The heat dissipating apparatus of claim 1, wherein the fan defines four through holes in four corners of the fan, each fan mounting portion defines two screw holes corresponding to the through holes of the fan.

3. The heat dissipating apparatus of claim 1, wherein the plurality of fins further define a plurality of slots parallel with the conducting base board at the air outlet, a rear end of the guiding board is accommodated in one of the slots.

* * * * *